US008296627B2

(12) United States Patent
Kim et al.

(10) Patent No.: US 8,296,627 B2
(45) Date of Patent: Oct. 23, 2012

(54) ADDRESS GENERATION APPARATUS AND METHOD OF DATA INTERLEAVER/DEINTERLEAVER

(75) Inventors: Nam-Il Kim, Daejeon (KR); Young-Jo Ko, Daejeon (KR); Young-Hoon Kim, Daejeon (KR)

(73) Assignees: Electronics and Telecommunications Research Institute, Daejeon (KR); Samsung Electronics Co., Ltd., Suwon-Si, Gyeonggi-Do (KR)

( * ) Notice: Subject to any disclaimer, the term of this patent is extended or adjusted under 35 U.S.C. 154(b) by 373 days.

(21) Appl. No.: 12/669,918

(22) PCT Filed: Mar. 21, 2008

(86) PCT No.: PCT/KR2008/001619
§ 371 (c)(1),
(2), (4) Date: Jan. 20, 2010

(87) PCT Pub. No.: WO2009/014298
PCT Pub. Date: Jan. 29, 2009

(65) Prior Publication Data
US 2010/0191932 A1 Jul. 29, 2010

(30) Foreign Application Priority Data
Jul. 20, 2007 (KR) ........................ 10-2007-0073103

(51) Int. Cl.
*G11C 29/00* (2006.01)
(52) U.S. Cl. ........................ 714/768; 714/781
(58) Field of Classification Search .................. 714/768, 714/781, 786
See application file for complete search history.

(56) References Cited

U.S. PATENT DOCUMENTS

| | | | | |
|---|---|---|---|---|
| 5,799,033 | A * | 8/1998 | Baggen | 375/250 |
| 6,314,534 | B1 * | 11/2001 | Agrawal et al. | 714/702 |
| 6,543,013 | B1 | 4/2003 | Li et al. | |
| 6,598,202 | B1 * | 7/2003 | Kim et al. | 714/786 |
| 6,668,343 | B1 * | 12/2003 | Kim et al. | 714/702 |
| 2002/0087923 | A1 | 7/2002 | Eroz et al. | |
| 2002/0099997 | A1 * | 7/2002 | Piret | 714/781 |
| 2002/0166087 | A1 | 11/2002 | Matsumoto | |
| 2003/0014700 | A1 * | 1/2003 | Giulietti et al. | 714/701 |

(Continued)

FOREIGN PATENT DOCUMENTS
KR 2003-0062079 7/2003

OTHER PUBLICATIONS

3GPP TS 25.212 V6.7.0—3rd Generation Partnership Project; Technical Specification Group Radio Access Network; Multiplexing and channel coding (FDD) (Release 6) (2005).

(Continued)

*Primary Examiner* — Yolanda L Wilson
(74) *Attorney, Agent, or Firm* — Nelson Mullins Riley & Scarborough LLP; EuiHoon Lee, Esq.

(57) ABSTRACT

Provided are an address generation apparatus and method of an interleaver/deinterleaver. By calculating coefficients of an address generator polynomial of an interleaver by determining exponents according to the number of prime factors forming a length of input data of the interleaver and generating an address of the deinterleaver using the calculated coefficients, errors generated when the address of the deinterleaver is generated can be removed, and right interleaver and deinterleaver addresses can be calculated.

4 Claims, 3 Drawing Sheets

U.S. PATENT DOCUMENTS

2003/0023909 A1* 1/2003 Ikeda et al. .................. 714/702
2008/0115034 A1* 5/2008 Cheng .......................... 714/755

OTHER PUBLICATIONS

Ryu, Jonghoon et al., "On Quadratic Equations for Quadratic Permutation Polynomials Over Integer Rings," *IEEE Transactions on Information Theory*, vol. 52(3):1254-1260 (2006).

Takeshita, Oscar Y. et al., "On Maximum Contention-Free Interleavers and Permutation Polynomials over Integer Rings," (draft) *IEEE Transactions on Information Theory* (2008).

Takeshita, Oscar Y. et al., "On Maximum Contention-Free Interleavers and Permutation Polynomials over Integer Rings," *IEEE Transactions on Information Theory*, vol. 52(3):1249-1253 (2006).

* cited by examiner

ADDRESS GENERATION APPARATUS AND METHOD OF DATA INTERLEAVER/DEINTERLEAVER

Related Applications

This application is a 35 U.S.C. §371 national stage filing of PCT Application No. PCT/KR2008/001619 filed on Mar. 21, 2008, which claims priority to, and the benefit of, Korean Patent Application No. 10-2007-0073103 filed on Jul. 20, 2007. The contents of the aforementioned applications are hereby incorporated by reference.

TECHNICAL FIELD

The present invention relates to an address generation apparatus and method of a data interleaver/deinterleaver, and more particularly, to an address generation apparatus and method of a data interleaver/deinterleaver that performs data interleaving and deinterleaving in parallel without an address collision, whereby the data deinterleaver can generate a right address by means of an address generator polynomial of the data interleaver using coefficients calculated based on prime factors forming a length of input data in a system for performing data interleaving/deinterleaving in parallel.

The present invention is derived from one of the Information Technology (IT) Research & Development (R&D) program of the Ministry of Information and Communication (MIC) and the Institute for Information Technology Advancement (IITA), Republic of Korea. [Project No.: 2005-S-404-13, Project Name: 3G Evolution Wireless Transmission Technology Development]

This application claims the benefit of Korean Patent Application No. 10-2007-0073103, filed on Jul. 20, 2007, in the Korean Intellectual Property Office, the disclosure of which is incorporated herein in its entirety by reference.

BACKGROUND ART

In order to increase transmission efficiency in a communication system, channel coding, such as turbo coding, is used.

Figure 1:
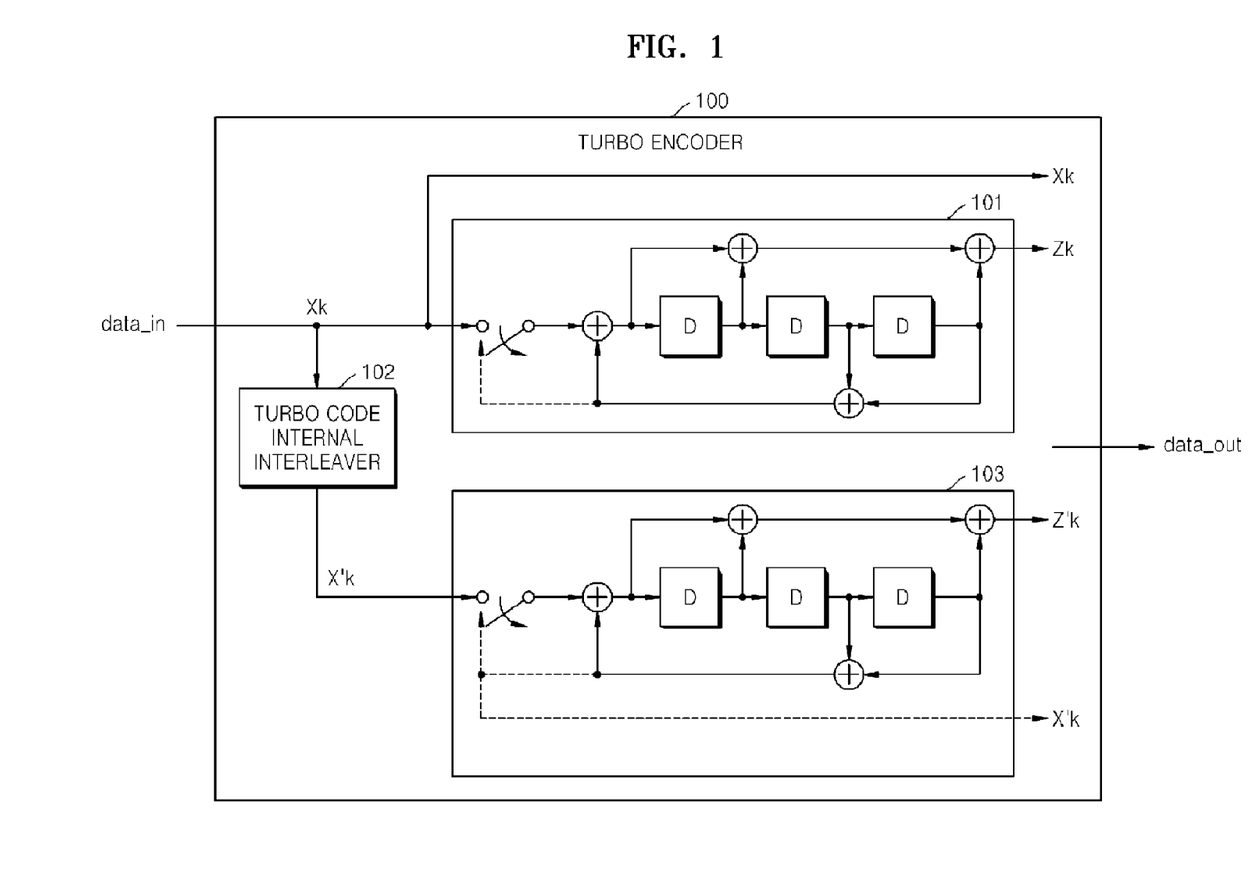
FIG. 1 is a block diagram of a conventional turbo encoder to which the present invention can be applied.

FIG. 1 illustrates a conventional turbo encoder 100, referring to FIG. 1, the conventional turbo encoder 100 includes two 8-state configuration encoders 101 and 103 and a turbo code internal interleaver 102, and performs channel coding using a Parallel Concatenated Convolutional Code (PCCC). Also, output data of data Xk that is input to the conventional turbo encoder 100 is Xk, Z'k, Z'k, and X'k.

The turbo code internal interleaver 102 includes an address generator that generates an address of the input data Xk using an address generator polynomial and interleaves the input data Xk according to the generated address.

The paper titled, 'On Maximum Contention-Free Interleavers and Permutation Polynomials Over Integer Rings' (IEEE Trans. On Information Theory, Vol. 52, No. 3, March 2006, Oscar Y. Takeshita) (hereinafter, 'reference 2') discloses a data interleaving method for performing data interleaving and deinterleaving in parallel, preventing address collision in parallel processing, and simplifying the complexity of hardware. According to the data interleaving method described in reference 2, an interleaving address of data is calculated using an address generator polynomial of an interleaver, and the data is interleaved according to the calculated address.

DISCLOSURE OF INVENTION

Technical Problem

The present invention provides a method of calculating a coefficient $f_2$ of an address generator polynomial, so as to remove an address generation error of a deinterleaver, and calculating right interleaver and deinterleaver addresses from a conventional method of calculating coefficients $f_1$ and $f_2$ of the address generator polynomial.

Technical Solution

The present invention provides a method of calculating coefficients of an address generator polynomial of an interleaver used for address generation of a turbo internal interleaver and a turbo internal deinterleaver used respectively in a turbo encoder and a turbo decoder.

The present invention also provides a method of generating a right address of the deinterleaver by using the coefficients of the address generator polynomial of the interleaver.

ADVANTAGEOUS EFFECTS

According to the present invention, by calculating coefficients of an address generator polynomial of an interleaver by determining exponents according to the numbers of prime factors forming a length of input data of the interleaver and generating an address of the deinterleaver using the calculated coefficients, errors generated when the address of the deinterleaver is generated can be removed, and right interleaver and deinterleaver addresses can be calculated.

In particular, if 2 is included in the prime factors, a coefficient $f_2$ of the interleaver address generator polynomial $f(x)=\mod(f_1 x+f_2 x^2, K)$ ($x=0, \ldots, K-1$, wherein K denotes the size of input data of the interleaver) is calculated at a multiple of 2 or $2^n$, and the address of the deinterleaver is generated by calculating coefficients $g_1$ and $g_2$ of a deinterleaver address generator polynomial $g(x)=\mod(g_1 x+g_2 x^2, K)$ ($x=0, \ldots, K-1$, wherein K denotes the size of input data of the interleaver) based on the calculated coefficient $f_2$, and accordingly, a right deinterleaver address can be generated.

In addition, in a system for performing parallel data interleaving and deinterleaving, the parallel data interleaving and deinterleaving is performed without address collision, and an address is calculated using interleaver and deinterleaver address generator polynomials without an additional memory for storing interleaver and deinterleaver addresses, and thus the complexity of hardware can be simplified.

DESCRIPTION OF DRAWINGS

The above and other features and advantages of the present invention will become more apparent by describing in detail exemplary embodiments thereof with reference to the attached drawings in which.

BEST MODE

According to an aspect of the present invention, there is provided an address generation apparatus of an interleaver for inputting data having a predetermined number of bits, the apparatus comprising: an exponent determiner calculating prime factors forming the size of the bits and determining exponents according to the number of all prime factors; a coefficient calculator calculating coefficients of an address generator polynomial of the interleaver based on the prime factors and the exponents; and an address generator generating an address by using the calculated coefficients.

According to another aspect of the present invention, there is provided an address generation apparatus of a deinterleaver for interleaving data having a predetermined number of bits, the apparatus comprising: a coefficient calculator calculating coefficients of an address generator polynomial of the deinterleaver based on coefficients of an address generator polynomial of the interleaving data; and an address generator generating an address of the deinterleaver by using the calculated coefficients, wherein the coefficients of the address generator polynomial of the interleaving data are calculated based on prime factors forming the size of the bits and exponents according to the number of all prime factors.

According to another aspect of the present invention, there is provided an address generation method of an interleaver for input data having a predetermined number of bits, the method comprising: calculating prime factors forming the size of the bits; determining exponents according to the number of all prime factors; calculating coefficients of an address generator polynomial of the interleaver based on the prime factors and the exponents; and generating an address by using the calculated coefficients.

According to another aspect of the present invention, there is provided an address generation method of a deinterleaver for interleaving data having a predetermined number of bits, the method comprising: calculating coefficients of an address generator polynomial of the deinterleaver based on coefficients of an address generator polynomial of the interleaving data; and generating an address of the deinterleaver by using the calculated coefficients, wherein the coefficients of the address generator polynomial of the interleaving data are calculated based on prime factors forming the size of the bits and exponents according to the number of all prime factors.

According to another aspect of the present invention, there is provided a computer readable recording medium storing a computer readable program for executing an address generation method of an interleaver and an address generation method of a deinterleaver.

MODE FOR INVENTION

The present invention will be described in detail by explaining embodiments of the invention with reference to the attached drawings. Like reference numbers are used to refer to like elements through at the drawings. In the following description, well-known functions or constructions are not described in detail since they would obscure the invention with unnecessary detail.

In the following description, when a part 'includes' or 'comprises' a component, this means that unless a specific description exists, another component is not excluded but can be further included.

The present invention provides a method of generating a coefficient $f_2$ of an address generator polynomial $f(x)=\mathrm{mod}(f_1x+f_2x^2, K)$ $(x=0, \ldots, K-1$, wherein K denotes the size of input data of an interleaver) for generating an address of the interleaver, and when coefficients $g_1$ and $g_2$ of an address generator polynomial $g(x)=\mathrm{mod}(g_1x+g_2x^2, K)$ $(x=0, \ldots, K-1$, wherein K denotes the size of input data of the interleaver) of a deinterleaver are generated using the coefficient $f_2$ generated in the provided method, a right deinterleaver address can be provided.

Since input data having K bits is described as an example in the present invention, the bit size K can be used as a length or size of the input data.

In reference 2, an address generator polynomial of a data interleaver is $f(x)=\mathrm{mod}(f_1x+f_2x^2, K)$ $(x=0, \ldots, K-1$, wherein K denotes the size of input data of the data interleaver), and an address generator polynomial of a deinterleaver is $g(x)=\mathrm{mod}(g_1x+g_2x^2, K)$ $(x=0, \ldots, K-1$, wherein K denotes the size of input data of the data interleaver).

Here, $\mathrm{mod}(a, b)$ is a modulus calculated value of a divided by b and is a remainder obtained by dividing a by b. For example, $\mathrm{mod}(3, 10)=3$, and $\mathrm{mod}(-3, 10)=7$.

A method of calculating coefficients $f_1$ and $f_2$ of the interleaver address generator polynomial will now be described.

If it is assumed that the length of input data of the data interleaver is K, a set of prime factors forming K is P, and elements of P are $P=\{p_1, p_2, \ldots, p_N\}$, $$K=\Pi_{p \in P} p^{n_{N,p}} \qquad [\text{Math.1}].$$

For example, when K=40, P={2, 5} and K=$2^3 \times 5$.
1) When K is not a multiple of 2 or is a multiple of 4,
calculate $f_1$: $f_1$ satisfying gcd $(f_1, K)=1$
calculate $f_2$:

$$f_2=\Pi_{p \in P} p^{n_{F,p}} \qquad [\text{Math.2}]$$

for all p satisfying $n_{F,p} \geq 1$ and $n_{N,p} \geq 1$.
2) When K is a multiple of 2 and not a multiple of 4,
calculate $f_1$: $f_1$ satisfying gcd $(f_1, K/2)=1$
calculate $f_2$:

$$f_2=\Pi_{p \in P} p^{n_{F,p}} \qquad [\text{Math.3}]$$

for all p satisfying, $n_{F,p} \geq 1$, $p \neq 2$, and $n_{N,p} \geq 1$, wherein $f_1+f_2$ is an odd number.

Here, gcd (a, b) is the greatest common divisor of a and b.
Thus, when K=40, since P={2, 5} and K=$2^3 \times 5$, $f_1 \in \{3, 7, 9, 11, 13, \ldots, 39\}$ and $f_2 \in \{10, 20, 30, 40\}$.

However, the method of calculating $f_2$ is not applied to all K.

The paper 'On Quadratic Inverses for Quadratic Permutation Polynomials Over Interger Rings' (IEEE Trans. On Information Theory, Vol. 52, No. 3, March 2006, Jonghoon Ryu and Oscar Y. Takeshita) (hereinafter, 'reference 3') discloses a method of calculating $f_2$ for all K. In reference 3, $$K=\Pi_{p \in P} p^{n_{N,p}} \qquad [\text{Math.4}],$$

and in order to calculate $$f_2=\Pi_{p \in P} p^{n_{F,p}} \qquad [\text{Math.5}],$$

the conditions below must be satisfied.

[Math. 6]

$$n_{F,2} \geq \begin{cases} \max\left(\left\lceil \frac{n_{K,2}-2}{2} \right\rceil, 1\right) & \text{if } n_{K,2} > 1 \\ 0 & \text{if } n_{K,2} = 0, 1 \end{cases} \qquad (\text{Equation 1})$$

-continued

[Math. 7]

$$n_{F,3} \geq \begin{cases} \max\left(\left\lceil \frac{n_{K,3}-1}{2} \right\rceil, 1\right) & \text{if } n_{K,3} > 1 \\ 0 & \text{if } n_{K,3} = 0, 1 \end{cases} \quad \text{(Equation 2)}$$

[Math. 8]

$$n_{F,p} \geq \left\lceil \frac{n_{K,p}}{2} \right\rceil \quad \text{if } p \neq 2, 3 \quad \text{(Equation 3)}$$

In this case, the address generator polynomial of the deinterleaver is $g(x)=\mod(g_1 x+g_2 x^2, K)$ ($x=0, \ldots, K-1$, wherein K denotes the size of input data of the data interleaver), and its calculation method can be referred to reference 3. For example, when $K=40$ and $(f_1, f_2)=(3, 10)$, $(g_1, g_2)=(27, 10)$ or $(7, 30)$.

The address generation method of a data interleaver, in reference 2, obtains an interleaver address using $f_1$ and $f_2$ with respect to the address generator polynomial $f(x)=\mod(f_1 x+f_2 x^2, K)$ ($x=0, \ldots, K-1$, wherein K denotes the size of input data of the data interleaver) and the corresponding deinterleaver address generator polynomial $g(x)=\mod(g_1 x+g_2 x^2, K)$ ($x=0, \ldots, K-1$, wherein K denotes the size of input data of the data interleaver). In addition, $g_1$ and $g_2$ are calculated using $f_1$ and $f_2$, which are obtained by referring to reference 3, and an address of the deinterleaver can be obtained using the calculated $g_1$ and $g_2$. However, an address of the deinterleaver using $f_1$ and $f_2$, which are obtained by referring to reference 2 may be incorrect.

For example, when $K=96$, since $P=\{2, 3\}$ and $K=2^5 \times 3$, $f_1 \in \{5, 7, 11, 13, \ldots, 95\}$ and $f_2 \in \{2 \times 3 \times 1, 2 \times 3 \times 2, 2 \times 3 \times 3, 2 \times 3 \times 4, 2 \times 3 \times 5, \ldots, 2 \times 3 \times 16\}$. In this case, if data deinterleaving is performed according to the deinterleaver address generator polynomial $g(x)=\mod(g_1 x+g_2 x^2, K)$, after interleaving data according to the interleaver address generator polynomial $f(x)=\mod(f_1 x+f_2 x^2, K)$ by selecting each one of $f_1$ and $f_2$ values, and generating $g_1$ and $g_2$ using $f_1$ and $f_2$ based on reference 3, an incorrect deinterleaver address is generated with respect to $f_2 \in \{2 \times 3 \times 1, 2 \times 3 \times 3, 2 \times 3 \times 5, \ldots, 2 \times 3 \times 15\}$. That is, the method of generating $f_2$ by referring to reference 2 has a problem in that an error is generated when a certain deinterleaver address is generated.

In addition, according to reference 3, when $K=90$, since $P=\{2, 3, 5\}$ and $K=2 \times 3^2 \times 5$, $f_1 \in \{7, 11, 13, \ldots, 89\}$ and $f_2 \in \{3 \times 5 \times 1, 3 \times 5 \times 2, 3 \times 5 \times 3, 3 \times 5 \times 4, 3 \times 5 \times 5, 3 \times 5 \times 6\}$. In this case, data is interleaved according to the interleaver address generator polynomial $f(x)=\mod(f_1 x+f_2 x^2, K)$ by selecting each one of $f_1$ and $f_2$ values. A deinterleaver performs data deinterleaving according to the deinterleaver address generator polynomial $g(x)=\mod(g_1 x+g_2 x^2, K)$ by calculating $g_1$ and $g_2$ using $f_1$ and $f_2$. Then, an incorrect deinterleaver address is generated with respect to $f_2 \in \{3 \times 5 \times 1, 3 \times 5 \times 3, 3 \times 5 \times 5\}$. That is, the method of generating $f_2$ by referring to reference 3 has a problem in that an error is generated when a certain deinterleaver address is generated.

An address generation apparatus of an interleaver for data interleaving according to an embodiment of the present invention is based on the data interleaving method disclosed in reference 2 described above.

In reference 2, the address generator polynomial of a data interleaver is $f(x)=\mod(f_1 x+f_2 x^2, K)$ ($x=0, \ldots, K-1$, wherein K denotes the size of input data of the data interleaver), and an address generator polynomial of a corresponding deinterleaver is $g(x)=\mod(g_1 x+g_2 x^2, K)$ ($x=0, \ldots, K-1$, wherein K denotes the size of input data of the data interleaver), wherein $\mod(a, b)$ is a modulus calculated value of a divided by b and is a remainder obtained by dividing a by b.

When it is assumed that the length of input data of an interleaver is K, a set of prime factors forming K is P, and elements of P are $P=\{p_1, p_2, \ldots, p_N\}$, $$K = \Pi_{p \in P} p^{n_{K,p}} \quad \text{[Math.9]}$$

In order to calculate $$f_2 = \Pi_{p \in P} p^{n_{F,p}} \quad \text{[Math.10]},$$

the exponent $n_{F,p}$ of a prime factor p is determined according to the conditions below.

[Math. 11]

$$n_{F,2} \geq \begin{cases} \max\left(\left\lceil \frac{n_{K,2}-2}{2} \right\rceil, 1\right) & \text{if } n_{K,2} > 1 \\ 0 & \text{if } n_{K,2} = 0, 1 \end{cases} \quad \text{(Equation 4)}$$

[Math. 12]

$$n_{F,3} \geq \begin{cases} \max\left(\left\lceil \frac{n_{K,3}-1}{2} \right\rceil, 1\right) & \text{if } n_{K,3} > 1 \\ 0 & \text{if } n_{K,3} = 0, 1 \end{cases} \quad \text{(Equation 5)}$$

[Math. 13]

$$n_{F,p} \geq \left\lceil \frac{n_{K,p}}{2} \right\rceil \quad \text{if } p \neq 2, 3 \quad \text{(Equation 6)}$$

A final $f_2$ calculated using results calculated by Equations 4, 5, and 6 is represented by Equation 7.

$$f_2 = \mod(\Pi_{p \in P} p^{n_{F,p}}, K) \quad \text{[Math.14]}$$

(Equation 7)

According to Equations 4, 5, and 6, $f_2$ is calculated by multiplying each of the prime factors forming K of K-bit input data by an arbitrary integer. An exponent of a multiplied prime factor is determined according to the prime factors (2, 3, prime factors excluding 2 and 3) and the number of prime factors, and as a result, $f_2$ has a multiple value of a power of a prime factor.

Referring to Equation 4, when 2 exists among the prime factors forming K, if the number of 2s is equal to or greater than 1 and equal to or less than 4, an exponent of 2 is determined as 1, and a coefficient $f_2$ is calculated a multiple value of 2. If the number of 2s is equal to or greater than 5, i.e., if the number of 2s is $2 \times n+1$ or $2 \times n+2$ (n is an integer equal to or greater than 2), an exponent of 2 is determined as n, and a coefficient $f_2$ is calculated a multiple value of $2^n$.

Referring to Equation 5, when 3 exists among the prime factors forming K, if the number of 3s is equal to or greater than 1 and equal to or less than 3, an exponent of 3 is determined as 1, and a coefficient $f_2$ is a multiple value of 3. If the number of 3s is equal to or greater than 4, i.e., if the number of 3s is $2 \times n$ or $2 \times n+1$ (n is an integer equal to or greater than 2), an exponent of 3 is determined as n, and a coefficient $f_2$ is calculated a multiple value of $3^n$.

Referring to Equation 6, when a prime factor p excluding 2 and 3 exists among the prime factors forming K, if the number of ps is equal to or greater than 1, i.e., if the number of ps is $2 \times n-1$ or $2 \times n$ (n is an integer equal to or greater than 1), an exponent of p is determined as n, and a coefficient $f_2$ is calculated a multiple value of $p^n$.

Figure 2:
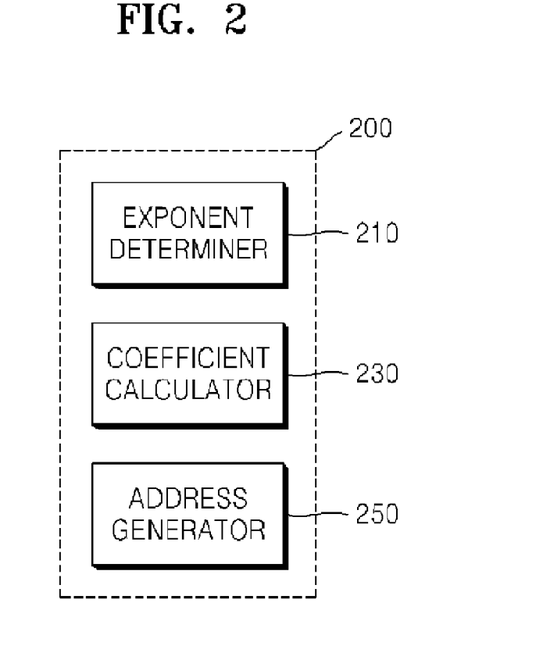
FIG. 2 is a block diagram of an address generation apparatus of an interleaver, according to an embodiment of the present invention.
Figure 4:
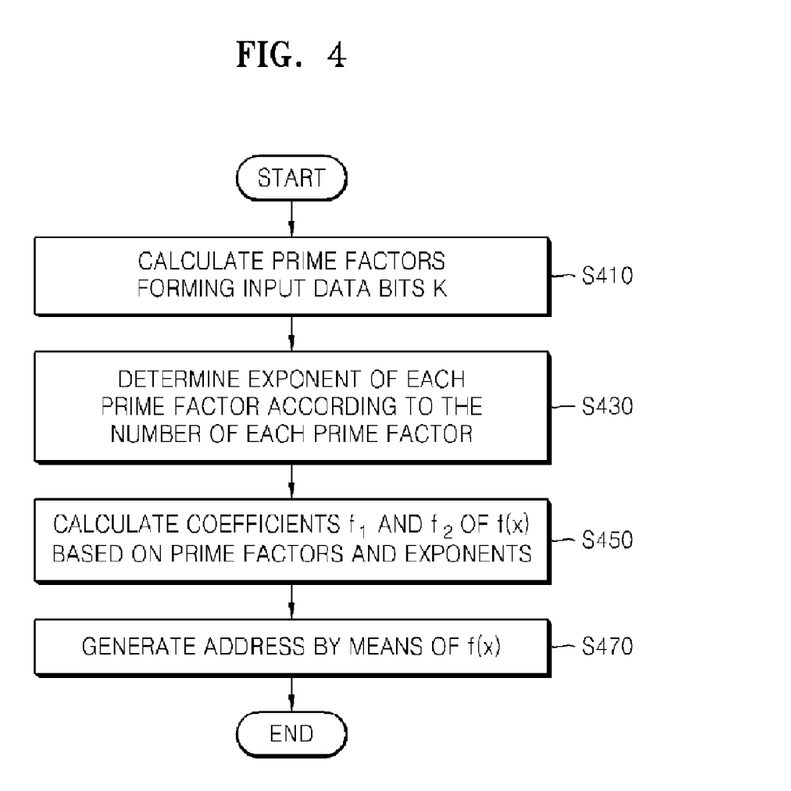
FIG. 4 is a flowchart of an address generation method of an interleaver, according to an embodiment of the present invention.

FIG. 2 is a block diagram of an address generation apparatus 200 of an interleaver, according to an embodiment of the present invention. FIG. 4 is a flowchart of an address generation method of an interleaver, according to an embodiment of the present invention.

An operation of the interleaver address generation apparatus 200 illustrated in FIG. 2 will now be described with reference to FIG. 4, and thus, a duplicated description will not be provided in detail.

Referring to FIGS. 2 and 4, the interleaver address generation apparatus 200 according to an embodiment of the present invention includes an exponent determiner 210, a coefficient calculator 230, and an address generator 250.

The exponent determiner 210 calculates prime factors forming a length K of K-bit input data, in operation S410, and determines an exponent of each prime factor according to the number of each calculated prime factors, in operation S430. An expression for determining the exponent of each prime factor is defined by Equations 4 to 6.

The coefficient calculator 230 calculates coefficients $f_1$ and $f_2$ of the address generator polynomial $f(x)=mod(f_1 x+f_2 x^2, K)$ ($x=0, \ldots, K-1$) based on the determined prime factors and exponents, in operation S450. The coefficient $f_1$ is calculated by multiplication of prime factors excluding the prime factors forming K. The coefficient $f_2$ is calculated by multiplying each prime factor forming K by an arbitrary integer and has a multiple value of a power of the prime factor due to the exponent of each prime factor.

The address generator 250 generates an address using the calculated coefficients $f_1$ and $f_2$, in operation S470.

Figure 3:
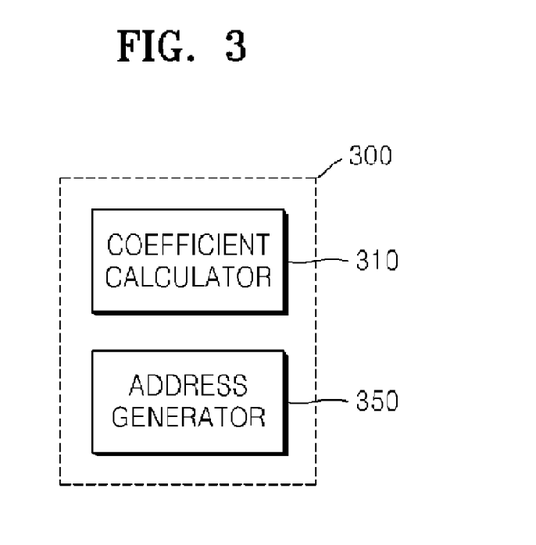
FIG. 3 is a block diagram of an address generation apparatus of a deinterleaver, according to an embodiment of the present invention.
Figure 5:
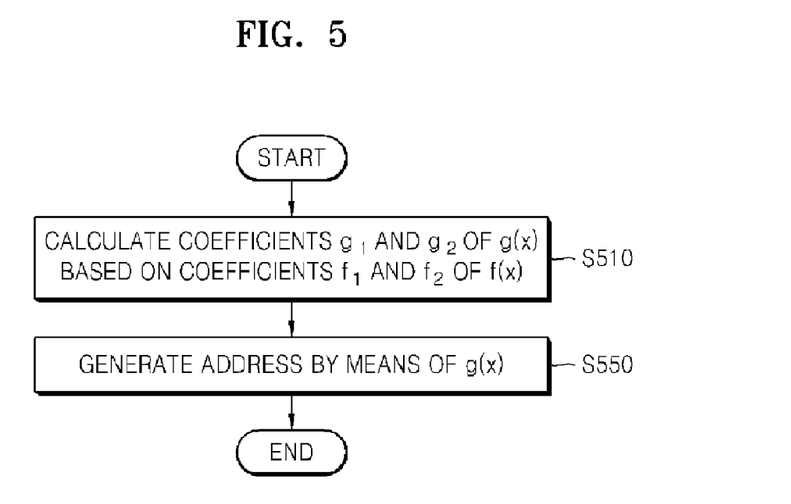
FIG. 5 is a flowchart of an address generation method of a deinterleaver, according to an embodiment of the present invention.

FIG. 3 is a block diagram of an address generation apparatus 300 of a deinterleaver according to an embodiment of the present invention. FIG. 5 is a flowchart of an address generation method of a deinterleaver, according to an embodiment of the present invention.

An operation of the address generation apparatus 300 of the deinterleaver illustrated in FIG. 3 will now be described with reference to FIG. 5, and a duplicated description will not be provided in detail.

Referring to FIGS. 3 and 5, the deinterleaver address generation apparatus 300 according to the present embodiment of the present invention includes a coefficient calculator 310 and an address generator 350. In general, a deinterleaver has the same structure as an interleaver except that a memory write sequence and a memory read sequence of the deinterleaver are opposite to those of the interleaver in an address generation process.

The coefficient calculator 310 calculates coefficients $g_1$ and $g_2$ of an address generator polynomial $g(x)=mod(g_1 x+g_2 x^2, K)$ ($x=0, \ldots, K-1$) for generating a deinterleaver address with respect to K-bit interleaving data in operation S510. In this case, the coefficients $g_1$ and $g_2$ are calculated based on the $f_1$ and $f_2$ of the address generator polynomial $f(x)=mod(f_1 x+f_2 x^2, K)$ ($x=0, \ldots, K-1$), which are calculated by an address generation apparatus of an interleaver. The quadratic term coefficient $f_2$ of the address generator polynomial $f(x)$ is calculated based on the prime factors forming K and an exponent of each prime factor determined according to the numbers of every prime factors.

If 2 exists among the prime factors forming K, and if the number of 2s is $2\times n+1$ or $2\times n+2$ (n is an integer equal to or greater than 2), the coefficients $g_1$ and $g_2$ are calculated based on the coefficient $f_1$ and the coefficient $f_2$ being a multiple of $2^n$. If the number of 2s is equal to or greater than 1 and equal to or less than 4, the coefficients $g_1$ and $g_2$ are calculated based on the coefficient $f_1$ and the coefficient $f_2$ being a multiple of 2.

If 3 exists among the prime factors forming K, and if the number of 3s is equal to or greater than 1 and equal to or less than 3, the coefficients $g_1$ and $g_2$ are calculated based on the coefficient $f_1$ and the coefficient $f_2$ being a multiple of 3. If the number of 3s is $2\times n$ or $2\times n+1$ (n is an integer equal to or greater than 2), the coefficients $g_1$ and $g_2$ are calculated based on the coefficient $f_1$ and the coefficient $f_2$ having a multiple value of $3^n$.

If a prime factor p excluding 2 and 3 exists among the prime factors forming K, and if the number of ps is $2\times n-1$ or $2\times n$ (n is an integer equal to or greater than 1), the coefficients $g_1$ and $g_2$ are calculated based on the coefficient $f_1$ and the coefficient $f_2$ having a multiple value of $p^n$.

The address generator 350 generates a deinterleaver address by using the calculated coefficients $g_1$ and $g_2$, in operation S550.

When the interleaver address generation method and the deinterleaver address generation method according to embodiments of the present invention are used, if K=90, since P={2, 3, 5} and K=$2\times 3^2 \times 5$, $f_1 \in \{7, 11, 13, \ldots, 89\}$ and $f_2 \in \{2\times 3\times 5\times 1, 2\times 3\times 5\times 2, 2\times 3\times 5\times 3\}$.

In this case, an interleaver address generation apparatus of an encoder interleaves data according to the address generator polynomial $f(x)=mod(f_1 x+f_2 x^2, K)$ by selecting each one of $f_1$ and $f_2$ values.

A decoder receives the interleaved data from the encoder, and a deinterleaver address generation apparatus of the decoder calculates $g_1$ and $g_2$ using $f_1$ and $f_2$ and performs data deinterleaving according to the deinterleaver address generator polynomial $g(x)=mod(g_1 x+g_2 x^2, K)$.

Thus, a right interleaver address and a right deinterleaver address can be obtained for all of ($f_1$, $f_2$) and ($g_1$, $g_2$).

The tables below show examples of coefficients $f_1$ and $f_2$ of the interleaver address generator polynomial $f(x)=mod(f_1 x+f_2 x^2, K)$ generated with respect to a length K of data input to an interleaver using the method provided in the present invention.

TABLE 1

| Number of interleaver input bits (K) | $f_1$ (multiplication of primes except for the below ($p_1, p_2, \ldots, p_n$)) | $f_2$ (m = 1, 2, 3, ...) | Remark |
|---|---|---|---|
| 24 | (2, 3) | mod(2 × 3 × m, K) | |
| 25 | (5) | mod(5 × m, K) | |
| 26 | (2, 13) | mod(2 × 13 × m, K) | |
| 27 | (3) | mod(3 × m, K) | |
| 28 | (2, 7) | mod(2 × 7 × m, K) | |
| 29 | (29) | mod(29 × m, K) | |
| 30 | (2, 3, 5) | mod(2 × 3 × 5 × m, K) | |
| 31 | (31) | mod(31 × m, K) | |
| 32 | (2) | mod(4 × m, K) | |
| 33 | (3, 11) | mod(3 × 11 × m, K) | |
| 34 | (2, 17) | mod(2 × 17 × m, K) | |
| 35 | (5, 7) | mod(5 × 7 × m, K) | |
| 36 | (2, 3) | mod(2 × 3 × m, K) | |
| 37 | (37) | mod(37 × m, K) | |
| 38 | (2, 19) | mod(2 × 19 × m, K) | |
| 39 | (3, 13) | mod(3 × 13 × m, K) | |
| 40 | (2, 5) | mod(2 × 5 × m, K) | |
| 42 | (2, 3, 7) | mod(2 × 3 × 7 × m, K) | |
| 44 | (2, 11) | mod(2 × 11 × m, K) | |
| 46 | (2, 23) | mod(2 × 23 × m, K) | |
| 48 | (2, 3) | mod(2 × 3 × m, K) | |
| 50 | (2, 5) | mod(2 × 5 × m, K) | |
| 52 | (2, 13) | mod(2 × 13 × m, K) | |
| 54 | (2, 3) | mod(2 × 3 × m, K) | |
| 56 | (2, 7) | mod(2 × 7 × m, K) | |
| 58 | (2, 29) | mod(2 × 29 × m, K) | |
| 60 | (2, 3, 5) | mod(2 × 3 × 5 × m, K) | |

TABLE 1-continued

| Number of interleaver input bits (K) | $f_1$ (multiplication of primes except for the below $(p_1, p_2, \ldots, p_n)$) | $f_2$ (m = 1, 2, 3, ...) | Remark |
|---|---|---|---|
| 62 | (2, 31) | mod(2 × 31 × m, K) | |
| 64 | (2) | mod(4 × m, K) | |
| 66 | (2, 3, 11) | mod(2 × 3 × 11 × m, K) | |
| 68 | (2, 17) | mod(2 × 17 × m, K) | |
| 70 | (2, 5, 7) | mod(2 × 5 × 7 × m, K) | |

TABLE 2

| Number of interleaver input bits (K) | $f_1$ (multiplication of primes except for the below $(p_1, p_2, \ldots, p_n)$) | $f_2$ (m = 1, 2, 3, ...) | Remark |
|---|---|---|---|
| 72 | (2, 3) | mod(2 × 3 × m, K) | |
| 80 | (2, 5) | mod(2 × 5 × m, K) | |
| 88 | (2, 11) | mod(2 × 11 × m, K) | |
| 96 | (2, 3) | mod(4 × 3 × m, K) | |
| 104 | (2, 13) | mod(2 × 13 × m, K) | |
| 112 | (2, 7) | mod(2 × 7 × m, K) | |
| 120 | (2, 3, 5) | mod(2 × 3 × 5 × m, K) | |
| 128 | (2) | mod(8 × m, K) | |
| 136 | (2, 17) | mod(2 × 17 × m, K) | |
| 144 | (2, 3) | mod(2 × 3 × m, K) | |
| 152 | (2, 19) | mod(2 × 19 × m, K) | |
| 160 | (2, 5) | mod(4 × 5 × m, K) | |
| 168 | (2, 3, 7) | mod(2 × 3 × 7 × m, K) | |
| 176 | (2, 11) | mod(2 × 11 × m, K) | |
| 184 | (2, 23) | mod(2 × 23 × m, K) | |
| 192 | (2, 3) | mod(4 × 3 × m, K) | |
| 200 | (2, 5) | mod(2 × 5 × m, K) | |
| 208 | (2, 13) | mod(2 × 13 × m, K) | |
| 216 | (2, 3) | mod(2 × 3 × m, K) | |
| 224 | (2, 7) | mod(4 × 7 × m, K) | |
| 232 | (2, 29) | mod(2 × 29 × m, K) | |
| 240 | (2, 3, 5) | mod(2 × 3 × 5 × m, K) | |
| 248 | (2, 31) | mod(2 × 31 × m, K) | |
| 256 | (2) | mod(8 × m, K) | |
| 264 | (2, 3, 11) | mod(2 × 3 × 11 × m, K) | |
| 272 | (2, 17) | mod(2 × 17 × m, K) | |
| 280 | (2, 5, 7) | mod(2 × 5 × 7 × m, K) | |
| 288 | (2, 3) | mod(4 × 3 × m, K) | |
| 296 | (2, 37) | mod(2 × 37 × m, K) | |
| 304 | (2, 19) | mod(2 × 19 × m, K) | |
| 312 | (2, 3, 13) | mod(2 × 3 × 13 × m, K) | |
| 320 | (2, 5) | mod(4 × 5 × m, K) | |

TABLE 3

| Number of interleaver input bits (K) | $f_1$ (multiplication of primes except for the below $(p_1, p_2, \ldots, p_n)$) | $f_2$ (m = 1, 2, 3, ...) | Remark |
|---|---|---|---|
| 328 | (2, 41) | mod(2 × 41 × m, K) | |
| 336 | (2, 3, 7) | mod(2 × 3 × 7 × m, K) | |
| 344 | (2, 43) | mod(2 × 43 × m, K) | |
| 352 | (2, 11) | mod(4 × 11 × m, K) | |
| 360 | (2, 3, 5) | mod(2 × 3 × 5 × m, K) | |
| 368 | (2, 23) | mod(2 × 23 × m, K) | |
| 376 | (2, 47) | mod(2 × 47 × m, K) | |

TABLE 3-continued

| Number of interleaver input bits (K) | $f_1$ (multiplication of primes except for the below $(p_1, p_2, \ldots, p_n)$) | $f_2$ (m = 1, 2, 3, ...) | Remark |
|---|---|---|---|
| 384 | (2, 3) | mod(8 × 3 × m, K) | |
| 392 | (2, 7) | mod(2 × 7 × m, K) | |
| 400 | (2, 5) | mod(2 × 5 × m, K) | |
| 408 | (2, 3, 17) | mod(2 × 3 × 17 × m, K) | |
| 416 | (2, 13) | mod(4 × 13 × m, K) | |
| 424 | (2, 53) | mod(2 × 53 × m, K) | |
| 432 | (2, 3) | mod(2 × 3 × m, K) | |
| 440 | (2, 5, 11) | mod(2 × 5 × 11 × m, K) | |
| 448 | (2, 7) | mod(4 × 7 × m, K) | |
| 456 | (2, 3, 19) | mod(2 × 3 × 19 × m, K) | |
| 464 | (2, 29) | mod(2 × 29 × m, K) | |
| 472 | (2, 59) | mod(2 × 59 × m, K) | |
| 480 | (2, 3, 5) | mod(4 × 3 × 5 × m, K) | |
| 488 | (2, 61) | mod(2 × 61 × m, K) | |
| 496 | (2, 31) | mod(2 × 31 × m, K) | |
| 504 | (2, 3, 7) | mod(2 × 3 × 7 × m, K) | |
| 512 | (2) | mod(16 × m, K) | |

TABLE 4

| Number of interleaver input bits (K) | $f_1$ (multiplication of primes except for the below $(p_1, p_2, \ldots, p_n)$) | $f_2$ (m = 1, 2, 3, ...) | Remark |
|---|---|---|---|
| 528 | (2, 3, 11) | mod(2 × 3 × 11 × m, K) | |
| 544 | (2, 17) | mod(4 × 17 × m, K) | |
| 560 | (2, 5, 7) | mod(2 × 5 × 7 × m, K) | |
| 576 | (2, 3) | mod(4 × 3 × m, K) | |
| 592 | (2, 37) | mod(2 × 37 × m, K) | |
| 608 | (2, 19) | mod(4 × 19 × m, K) | |
| 624 | (2, 3, 13) | mod(2 × 3 × 13 × m, K) | |
| 640 | (2, 5) | mod(8 × 5 × m, K) | |
| 656 | (2, 41) | mod(2 × 41 × m, K) | |
| 672 | (2, 3, 7) | mod(4 × 3 × 7 × m, K) | |
| 688 | (2, 43) | mod(2 × 43 × m, K) | |
| 704 | (2, 11) | mod(4 × 11 × m, K) | |
| 720 | (2, 3, 5) | mod(2 × 3 × 5 × m, K) | |
| 736 | (2, 23) | mod(4 × 23 × m, K) | |
| 752 | (2, 47) | mod(2 × 47 × m, K) | |
| 768 | (2, 3) | mod(8 × 3 × m, K) | |
| 784 | (2, 7) | mod(2 × 7 × m, K) | |
| 800 | (2, 5) | mod(4 × 5 × m, K) | |
| 816 | (2, 3, 17) | mod(2 × 3 × 17 × m, K) | |
| 832 | (2, 13) | mod(4 × 13 × m, K) | |
| 848 | (2, 53) | mod(2 × 53 × m, K) | |
| 864 | (2, 3) | mod(4 × 3 × m, K) | |
| 880 | (2, 5, 11) | mod(2 × 5 × 11 × m, K) | |
| 896 | (2, 7) | mod(8 × 7 × m, K) | |
| 912 | (2, 3, 19) | mod(2 × 3 × 19 × m, K) | |
| 928 | (2, 29) | mod(4 × 29 × m, K) | |
| 944 | (2, 59) | mod(2 × 59 × m, K) | |
| 960 | (2, 3, 5) | mod(4 × 3 × 5 × m, K) | |
| 976 | (2, 61) | mod(2 × 61 × m, K) | |
| 992 | (2, 31) | mod(4 × 31 × m, K) | |

TABLE 4-continued

| Number of interleaver input bits (K) | $f_1$ (multiplication of primes except for the below ($p_1, p_2, \ldots, p_n$)) | $f_2$ (m = 1, 2, 3, ...) | Remark |
|---|---|---|---|
| 1008 | (2, 3, 7) | mod($2 \times 3 \times 7 \times m$, K) | |
| 1024 | (2) | mod($16 \times m$, K) | |

TABLE 5

| Number of interleaver input bits (K) | $f_1$ (multiplication of primes except for the below ($p_1, p_2, \ldots, p_n$)) | $f_2$ (m = 1, 2, 3, ...) | Remark |
|---|---|---|---|
| 1056 | (2, 3, 11) | mod($4 \times 3 \times 11 \times m$, K) | |
| 1088 | (2, 17) | mod($4 \times 17 \times m$, K) | |
| 1120 | (2, 5, 7) | mod($4 \times 5 \times 7 \times m$, K) | |
| 1152 | (2, 3) | mod($8 \times 3 \times m$, K) | |
| 1184 | (2, 37) | mod($4 \times 37 \times m$, K) | |
| 1216 | (2, 19) | mod($4 \times 19 \times m$, K) | |
| 1248 | (2, 3, 13) | mod($4 \times 3 \times 13 \times m$, K) | |
| 1280 | (2, 5) | mod($8 \times 5 \times m$, K) | |
| 1312 | (2, 41) | mod($4 \times 41 \times m$, K) | |
| 1344 | (2, 3, 7) | mod($4 \times 3 \times 7 \times m$, K) | |
| 1376 | (2, 43) | mod($4 \times 43 \times m$, K) | |
| 1408 | (2, 11) | mod($8 \times 11 \times m$, K) | |
| 1440 | (2, 3, 5) | mod($4 \times 3 \times 5 \times m$, K) | |
| 1472 | (2, 23) | mod($4 \times 23 \times m$, K) | |
| 1504 | (2, 47) | mod($4 \times 47 \times m$, K) | |
| 1536 | (2, 3) | mod($16 \times 3 \times m$, K) | |
| 1568 | (2, 7) | mod($4 \times 7 \times m$, K) | |
| 1600 | (2, 5) | mod($4 \times 5 \times m$, K) | |
| 1632 | (2, 3, 17) | mod($4 \times 3 \times 17 \times m$, K) | |
| 1664 | (2, 13) | mod($8 \times 13 \times m$, K) | |
| 1696 | (2, 53) | mod($4 \times 53 \times m$, K) | |
| 1728 | (2, 3) | mod($4 \times 3 \times m$, K) | |
| 1760 | (2, 5, 11) | mod($4 \times 5 \times 11 \times m$, K) | |
| 1792 | (2, 7) | mod($8 \times 7 \times m$, K) | |
| 1824 | (2, 3, 19) | mod($4 \times 3 \times 19 \times m$, K) | |
| 1856 | (2, 29) | mod($4 \times 29 \times m$, K) | |
| 1888 | (2, 59) | mod($4 \times 59 \times m$, K) | |
| 1920 | (2, 3, 5) | mod($8 \times 3 \times 5 \times m$, K) | |
| 1952 | (2, 61) | mod($4 \times 61 \times m$, K) | |
| 1984 | (2, 31) | mod($4 \times 31 \times m$, K) | |
| 2016 | (2, 3, 7) | mod($4 \times 3 \times 7 \times m$, K) | |
| 2048 | (2) | mod($32 \times m$, K) | |

TABLE 6

| Number of interleaver input bits (K) | $f_1$ (multiplication of primes except for the below ($p_1, p_2, \ldots, p_n$)) | $f_2$ (m = 1, 2, 3, ...) | Remark |
|---|---|---|---|
| 2112 | (2, 3, 11) | mod($4 \times 3 \times 11 \times m$, K) | |
| 2176 | (2, 17) | mod($8 \times 17 \times m$, K) | |
| 2240 | (2, 5, 7) | mod($4 \times 5 \times 7 \times m$, K) | |
| 2304 | (2, 3) | mod($8 \times 3 \times m$, K) | |
| 2368 | (2, 37) | mod($4 \times 37 \times m$, K) | |
| 2432 | (2, 19) | mod($8 \times 19 \times m$, K) | |
| 2496 | (2, 3, 13) | mod($4 \times 3 \times 13 \times m$, K) | |
| 2560 | (2, 5) | mod($16 \times 5 \times m$, K) | |
| 2624 | (2, 41) | mod($4 \times 41 \times m$, K) | |
| 2688 | (2, 3, 7) | mod($8 \times 3 \times 7 \times m$, K) | |
| 2752 | (2, 43) | mod($4 \times 43 \times m$, K) | |
| 2816 | (2, 11) | mod($8 \times 11 \times m$, K) | |
| 2880 | (2, 3, 5) | mod($4 \times 3 \times 5 \times m$, K) | |
| 2944 | (2, 23) | mod($8 \times 23 \times m$, K) | |
| 3008 | (2, 47) | mod($4 \times 47 \times m$, K) | |
| 3072 | (2, 3) | mod($16 \times 3 \times m$, K) | |
| 3136 | (2, 7) | mod($4 \times 7 \times m$, K) | |
| 3200 | (2, 5) | mod($8 \times 5 \times m$, K) | |
| 3264 | (2, 3, 17) | mod($4 \times 3 \times 17 \times m$, K) | |
| 3328 | (2, 13) | mod($8 \times 13 \times m$, K) | |
| 3392 | (2, 53) | mod($4 \times 53 \times m$, K) | |
| 3456 | (2, 3) | mod($8 \times 3 \times m$, K) | |
| 3520 | (2, 5, 11) | mod($4 \times 5 \times 11 \times m$, K) | |
| 3584 | (2, 7) | mod($16 \times 7 \times m$, K) | |
| 3648 | (2, 3, 19) | mod($4 \times 3 \times 19 \times m$, K) | |
| 3712 | (2, 29) | mod($8 \times 29 \times m$, K) | |
| 3776 | (2, 59) | mod($4 \times 59 \times m$, K) | |
| 3840 | (2, 3, 5) | mod($8 \times 3 \times 5 \times m$, K) | |
| 3904 | (2, 61) | mod($4 \times 61 \times m$, K) | |
| 3968 | (2, 31) | mod($8 \times 31 \times m$, K) | |
| 4032 | (2, 3, 7) | mod($4 \times 3 \times 7 \times m$, K) | |
| 4096 | (2) | mod($32 \times m$, K) | |
| 4160 | (2, 5, 13) | mod($4 \times 5 \times 13 \times m$, K) | |
| 4224 | (2, 3, 11) | mod($8 \times 3 \times 11 \times m$, K) | |
| 4288 | (2, 67) | mod($4 \times 67 \times m$, K) | |
| 4352 | (2, 17) | mod($8 \times 17 \times m$, K) | |
| 4416 | (2, 3, 23) | mod($4 \times 3 \times 23 \times m$, K) | |
| 4480 | (2, 5, 7) | mod($8 \times 5 \times 7 \times m$, K) | |
| 4544 | (2, 71) | mod($4 \times 71 \times m$, K) | |
| 4608 | (2, 3) | mod($16 \times 3 \times m$, K) | |
| 4672 | (2, 73) | mod($4 \times 73 \times m$, K) | |
| 4736 | (2, 37) | mod($8 \times 37 \times m$, K) | |
| 4800 | (2, 3, 5) | mod($4 \times 3 \times 5 \times m$, K) | |
| 4864 | (2, 19) | mod($8 \times 19 \times m$, K) | |
| 4928 | (2, 7, 11) | mod($4 \times 7 \times 11 \times m$, K) | |
| 4992 | (2, 3, 13) | mod($8 \times 3 \times 13 \times m$, K) | |
| 5056 | (2, 79) | mod($4 \times 79 \times m$, K) | |
| 5120 | (2, 5) | mod($16 \times 5 \times m$, K) | |
| 5184 | (2, 3) | mod($4 \times 9 \times m$, K) | |
| 5248 | (2, 41) | mod($8 \times 41 \times m$, K) | |
| 5312 | (2, 83) | mod($4 \times 83 \times m$, K) | |
| 5376 | (2, 3, 7) | mod($8 \times 3 \times 7 \times m$, K) | |
| 5440 | (2, 5, 17) | mod($4 \times 5 \times 17 \times m$, K) | |
| 5504 | (2, 43) | mod($8 \times 43 \times m$, K) | |
| 5568 | (2, 3, 29) | mod($4 \times 3 \times 29 \times m$, K) | |
| 5632 | (2, 11) | mod($16 \times 11 \times m$, K) | |
| 5696 | (2, 89) | mod($4 \times 89 \times m$, K) | |
| 5760 | (2, 3, 5) | mod($8 \times 3 \times 5 \times m$, K) | |
| 5824 | (2, 7, 13) | mod($4 \times 7 \times 13 \times m$, K) | |
| 5888 | (2, 23) | mod($8 \times 23 \times m$, K) | |

TABLE 6-continued

| Number of interleaver input bits (K) | $f_1$ (multiplication of primes except for the below ($p_1, p_2, \ldots, p_n$)) | $f_2$ (m = 1, 2, 3, ...) | Remark |
|---|---|---|---|
| 5952 | (2, 3, 31) | mod(4 × 3 × 31 × m, K) | |
| 6016 | (2, 47) | mod(8 × 47 × m, K) | |
| 6080 | (2, 5, 19) | mod(4 × 5 × 19 × m, K) | |
| 6144 | (2, 3) | mod(32 × 3 × m, K) | |

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

While this invention has been particularly shown and described with reference to preferred embodiments thereof, it will be understood by one skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:

1. An address generation method of an interleaver for input data having a predetermined number of bits, the method comprising:
calculating prime factors forming the size of the bits;
determining exponents according to the number of all prime factors;
calculating coefficients of an address generator polynomial of the interleaver based on the prime factors and the exponents; and
generating an address by using the calculated coefficients,
wherein the determining of the exponents comprises, if 2 exists among the prime factors forming the bit size, and the number of 2s is 2×n+1 or 2×n+2 (n is an integer equal to or greater than 2), determining an exponent of 2 as n, and
a coefficient of a quadratic term of the address generator polynomial calculated by the prime factor 2 comprises a multiple of $2^n$.

2. An address generation method of an interleaver for input data having a predetermined number of bits, the method comprising:
calculating prime factors forming the size of the bits;
determining exponents according to the number of all prime factors;
calculating coefficients of an address generator polynomial of the interleaver based on the prime factors and the exponents; and
generating an address by using the calculated coefficients,
wherein the determining of the exponents comprises, if 3 exists among the prime factors forming the bit size, and the number of 3s is 2×n or 2×n+1 (n is an integer equal to or greater than 2), determining an exponent of 3 as n, and
a coefficient of a quadratic term of the address generator polynomial calculated by the prime factor 3 comprises a multiple of $3^n$.

3. An address generation method of an interleaver for input data having a predetermined number of bits, the method comprising:
calculating prime factors forming the size of the bits;
determining exponents according to the number of all prime factors;
calculating coefficients of an address generator polynomial of the interleaver based on the prime factors and the exponents; and
generating an address by using the calculated coefficients,
wherein the determining of the exponents comprises, if a prime factor p, excluding 2 and 3, exists among the prime factors forming the bit size, and the number of ps is 2×n−1 or 2×n (n is an integer equal to or greater than 1), determining an exponent of p as n, and
a coefficient of a quadratic term of the address generator polynomial calculated by the prime factor p comprises a multiple of $p^n$.

4. An address generation method of a deinterleaver for interleaving data having a predetermined number of bits, the method comprising:
calculating coefficients of an address generator polynomial of the deinterleaver based on coefficients of an address generator polynomial of the interleaving data; and
generating an address of the deinterleaver by using the calculated coefficients,
wherein the coefficients of the address generator polynomial of the interleaving data are calculated based on prime factors forming the size of the bits and exponents according to the number of all prime factors,
wherein the calculating of the coefficients comprises, if 2 exists among the prime factors forming the bit size, and the number of 2s is 2×n+1 or 2×n+2 (n is an integer equal to or greater than 2), calculating the coefficients of the address generator polynomial of the deinterleaver based on a coefficient of a quadratic term of the address generator polynomial of the interleaving data, wherein the coefficient comprises a multiple of $2^n$.

* * * * *